United States Patent
Li et al.

(10) Patent No.: US 10,152,274 B2
(45) Date of Patent: Dec. 11, 2018

(54) METHOD AND APPARATUS FOR READING/WRITING DATA FROM/INTO FLASH MEMORY, AND USER EQUIPMENT

(71) Applicant: Huawei Technologies Co., Ltd., Shenzhen (CN)

(72) Inventors: Zhigang Li, Shenzhen (CN); Guojun Shi, Beijing (CN); Yingchun Zhao, Beijing (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 49 days.

(21) Appl. No.: 15/319,166

(22) PCT Filed: Jun. 25, 2014

(86) PCT No.: PCT/CN2014/080686
§ 371 (c)(1),
(2) Date: Dec. 15, 2016

(87) PCT Pub. No.: WO2015/196378
PCT Pub. Date: Dec. 30, 2015

(65) Prior Publication Data
US 2017/0153850 A1    Jun. 1, 2017

(51) Int. Cl.
*G06F 12/00* (2006.01)
*G06F 3/06* (2006.01)
(Continued)

(52) U.S. Cl.
CPC ............ *G06F 3/0656* (2013.01); *G06F 3/061* (2013.01); *G06F 3/0679* (2013.01);
(Continued)

(58) Field of Classification Search
CPC ... G06F 3/0656; G06F 3/0679; G06F 12/0246
(Continued)

(56) References Cited

U.S. PATENT DOCUMENTS 6,016,472 A  *  1/2000  Ali ........................ G11C 7/16
                                                          704/219
8,688,900 B2    4/2014  Eleftheriou et al.
(Continued)

FOREIGN PATENT DOCUMENTS

| CN | 101533662 A | 9/2009 |
|---|---|---|
| CN | 103064803 A | 4/2013 |

(Continued)

OTHER PUBLICATIONS

Machine Translation and Abstract of Chinese Publication No. CN101533662, Sep. 16, 2009, 7 pages.
(Continued)

*Primary Examiner* — Jae U Yu
(74) *Attorney, Agent, or Firm* — Conley Rose, P.C.

(57) ABSTRACT

A method and an apparatus for reading/writing data from/into a flash memory, and user equipment are presented. The method includes receiving a read data instruction, where the read data instruction includes a size of to-be-read data and a physical address of the to-be-read data in the flash memory; searching a buffer for the physical address; when the physical address is not found in the buffer, dividing a buffer data area from internal memory according to the size of the to-be-read data and an actual physical block size of the flash memory; and reading the to-be-read data from the flash memory according to the physical address and buffering the to-be-read data into the buffer data area.

12 Claims, 4 Drawing Sheets

(51) Int. Cl.
    *G06F 12/08* (2016.01)
    *G06F 12/02* (2006.01)
    *G11C 8/00* (2006.01)
(52) U.S. Cl.
    CPC .......... *G06F 12/0246* (2013.01); *G06F 12/08* (2013.01); *G06F 2212/7203* (2013.01); *G11C 8/00* (2013.01)
(58) Field of Classification Search
    USPC ........................................................ 711/103
    See application file for complete search history.

(56) References Cited

U.S. PATENT DOCUMENTS

| | | |
|---|---|---|
| 2005/0086198 A1 | 4/2005 | Shimizu et al. |
| 2005/0144367 A1 | 6/2005 | Sinclair |
| 2010/0037009 A1 | 2/2010 | Yano et al. |
| 2012/0134203 A1 | 5/2012 | Miura et al. |
| 2013/0117497 A1 | 5/2013 | Cui et al. |

FOREIGN PATENT DOCUMENTS

| | | |
|---|---|---|
| CN | 103425602 A | 12/2013 |
| CN | 103559146 A | 2/2014 |
| JP | 2007528079 A | 10/2007 |
| JP | 2010250845 A | 11/2010 |

OTHER PUBLICATIONS

Machine Translation and Abstract of Chinese Publication No. CN103064803, Apr. 24, 2013, 10 pages.
Machine Translation and Abstract of Chinese Publication No. CN103425602, Dec. 4, 2013, 22 pages.
Machine Translation and Abstract of Chinese Publication No. CN103559146, Feb. 5, 2014, 7 pages.
Jo, H., et al., "FAB: Flash-Aware Buffer Management Policy for Portable Media Players," XP008116208, Apr. 15, 2006, pp. 485-493.
Foreign Communication From a Counterpart Application, European Application No. 14895589.1, Extended European Search Report dated May 30, 2017, 8 pages.
Foreign Communication From a Counterpart Application, PCT Application No. PCT/CN2014/080686, English Translation of International Search Report dated Mar. 30, 2015, 2 pages.
Foreign Communication From a Counterpart Application, PCT Application No. PCT/CN2014/080686, English Translation of International Written Opinion dated Mar. 30, 2015, 12 pages.
Foreign Communication From a Counterpart Application, Japanese Application No. 2016-575098, Japanese Office Action dated Feb. 27, 2018, 9 pages.
Foreign Communication From a Counterpart Application, Japanese Application No. 2016-575098, English Translation of Japanese Office Action dated Feb. 27, 2018, 10 pages.

\* cited by examiner

METHOD AND APPARATUS FOR READING/WRITING DATA FROM/INTO FLASH MEMORY, AND USER EQUIPMENT

CROSS-REFERENCE TO RELATED APPLICATIONS

This application is a national stage of International Application No. PCT/CN2014/080686, filed Jun. 25, 2014, which is hereby incorporated by reference in its entirety.

TECHNICAL FIELD

The present disclosure relates to the field of data processing, and in particular, to a method and an apparatus for reading/writing data from/into a flash memory, and user equipment.

BACKGROUND

Currently, embedded multimedia cards (eMMC) are widely used as main storage mediums of mobile phones, and an internal storage device of an eMMC is a non-linear flash memory (NAND flash), which is referred to as a flash memory for short. An NAND flash reads and writes data in a unit of page, and erases data in a unit of block. At first, a page of an NAND flash is of 512 bytes. However, with development of an NAND flash process, a capacity of the NAND flash becomes increasingly large, and a size of a page is also increased to 8 kilo bytes ("KB" or "K") or 16 K. The eMMC is a standard and uniform protocol, and a specified unit of reading/writing is 512 bytes. As a result, a write amplification factor is increased and operation efficiency and a service life of the eMMC are affected.

In the prior art, to be compatible with eMMCs of different manufacturers and types, in a Linux system, physical blocks are uniform in size, for example, 512 bytes, using an eMMC driver. In this way, because a unit of reading/writing of an NAND flash is page, that is, 8 KB or 16 KB, although the eMMC reads/writes 512 bytes, operations are amplified to 8 K or 16 K for the NAND flash, leading to problems of low reading and writing efficiency of the eMMC and a short service life of the eMMC.

SUMMARY

Embodiments of the present disclosure provide a method and an apparatus for reading/writing data from/into a flash memory, and user equipment, which can resolve problems of low reading and writing efficiency of the flash memory and a short service life of the flash memory.

According to a first aspect, a method for reading data from a flash memory is provided, where the method includes receiving a read data instruction, where the read data instruction includes a size of to-be-read data and a physical address of the to-be-read data in the flash memory; searching a buffer for the physical address; when the physical address is not found in the buffer, dividing a buffer data area from internal memory according to the size of the to-be-read data and an actual physical block size of the flash memory; and reading the to-be-read data from the flash memory according to the physical address and buffering the to-be-read data into the buffer data area.

With reference to the first aspect, in a first implementation manner of the first aspect, a size of the buffer data area is greater than the size of the to-be-read data, and the size of the buffer data area is an integer multiple of the actual physical block size of the flash memory.

With reference to the first aspect, in a second implementation manner of the first aspect, a size of the buffer data area is equal to the size of the to-be-read data, and the size of the buffer data area is an integer multiple of the actual physical block size of the flash memory.

With reference to the first implementation manner of the first aspect or the second implementation manner of the first aspect, in a third implementation manner of the first aspect, after the dividing a buffer data area from internal memory and before the reading the to-be-read data from the flash memory according to the physical address, the method further includes dividing a buffer header (buffer_head or buffer_heads) that corresponds to the buffer data area from the internal memory, and buffering attribute information of the buffer data area and the physical address into the buffer_head, where the attribute information of the buffer data area includes an address and the size of the buffer data area.

With reference to the first aspect or any implementation manner of the foregoing three implementation manners of the first aspect, in a fourth implementation manner of the first aspect, the actual physical block size of the flash memory is acquired by a driver layer of the flash memory from a correspondence table between identifier information card identity (CID) of the flash memory and the actual physical block size of the flash memory according to the identifier information CID of the flash memory.

With reference to the first aspect, in a fifth implementation manner of the first aspect, before the receiving a read data instruction, the method further includes receiving the actual physical block size of the flash memory that is sent by the driver layer of the flash memory using a block device layer of the flash memory.

According to a second aspect, a method for writing data into a flash memory is provided, where the method includes receiving a write data instruction, where the write data instruction includes to-be-written data, a size of the to-be-written data, and a physical address of the to-be-written data in the flash memory; dividing a buffer data area from internal memory according to the size of the to-be-written data and an actual physical block size of the flash memory, and dividing a buffer_head that corresponds to the buffer data area; buffering the to-be-written data into the buffer data area, and buffering attribute information of the buffer data area and the physical address into the buffer_head, where the attribute information of the buffer data area includes an address and a size of the buffer data area; and writing the to-be-written data into the flash memory according to the physical address.

With reference to the second aspect, in a first implementation manner of the second aspect, the method further includes adding identifier information to the buffer data area, and when data in the buffer data area is not consistent with data in the flash memory, identifying the identifier information as information indicating dirty data; and when an occupancy rate of the internal memory is greater than a preset first threshold, writing, into the flash memory, data in the buffer data area that corresponds to the identifier information being the information indicating dirty data; or when a time that the buffer data area resides is greater than a preset second threshold, writing, into the flash memory, data in the buffer data area that corresponds to the identifier information being the information indicating dirty data.

According to a third aspect, an apparatus for reading data from a flash memory is provided, where the apparatus includes a receiving unit, a searching unit, a dividing unit, and a buffering unit, where the receiving unit is configured to receive a read data instruction, where the read data instruction includes a size of to-be-read data and a physical address of the to-be-read data in the flash memory; the searching unit is configured to search a buffer for the physical address received by the receiving unit; the dividing unit is configured to, when the searching unit does not find the physical address in the buffer, divide a buffer data area from internal memory according to the size of the to-be-read data and an actual physical block size of the flash memory; and the buffering unit is configured to read the to-be-read data from the flash memory according to the physical address and buffer the to-be-read data into the buffer data area divided by the dividing unit.

With reference to the third aspect, in a first implementation manner of the third aspect, the dividing unit is further configured to divide a buffer_head that corresponds to the buffer data area from the internal memory, and buffer attribute information of the buffer data area and the physical address to the buffer-head, where the attribute information of the buffer data area includes an address and a size of the buffer data area, where the size of the buffer data area is greater than the size of the to-be-read data, and the size of the buffer data area is an integer multiple of the actual physical block size of the flash memory; or the size of the buffer data area is equal to the size of the to-be-read data, and the size of the buffer data area is an integer multiple of the actual physical block size of the flash memory; and the actual physical block size of the flash memory is acquired by a driver layer of the flash memory from a correspondence table between identifier information CID of the flash memory and the actual physical block size of the flash memory according to the identifier information CID of the flash memory.

With reference to the third aspect or the first implementation manner of the third aspect, in a second implementation manner of the third aspect, the receiving unit is further configured to receive the actual physical block size of the flash memory that is sent by the driver layer of the flash memory using a block device layer of the flash memory.

According to a fourth aspect, an apparatus for writing data into a flash memory is provided, where the apparatus includes a receiving unit, a dividing unit, a buffering unit, and a writing unit, where the receiving unit is configured to receive a write data instruction, where the write data instruction includes to-be-written data, a size of the to-be-written data, and a physical address of the to-be-written data in the flash memory; the dividing unit is configured to divide a buffer data area from internal memory according to the size of the to-be-written data and an actual physical block size of the flash memory received by the receiving unit, and divide a buffer_head that corresponds to the buffer data area; the buffering unit is configured to buffer the to-be-written data into the buffer data area divided by the dividing unit, and buffer attribute information of the buffer data area and the physical address into the buffer_head divided by the dividing unit, where the attribute information of the buffer data area includes a logical address and a size of the buffer data area; and the writing unit is configured to write the to-be-written data into the flash memory according to the physical address.

With reference to the fourth aspect, in a first implementation manner of the fourth aspect, the apparatus further includes an adding unit configured to add identifier information to the buffer data area, and when data in the buffer data area is not consistent with data in the flash memory, identify the identifier information as information indicating dirty data, where the writing unit is further configured to, when an occupancy rate of the internal memory is greater than a preset first threshold, write, into the flash memory, data in the buffer data area that corresponds to the identifier information, being the information indicating dirty data, added by the adding unit; or when a time that the buffer data area resides is greater than a preset second threshold, write, into the flash memory, data in the buffer data area that corresponds to the identifier information, being the information indicating dirty data, added by the adding unit.

According to a fifth aspect, user equipment is provided, where the equipment includes a network interface; one or more processors; a storage, where the storage includes internal memory and a flash memory; and one or more programs, stored in the storage and configured to be executed by the one or more processors, where the one or more programs include receiving a read data instruction, where the read data instruction includes a size of to-be-read data and a physical address of the to-be-read data in the flash memory; searching a buffer for the physical address; when the physical address is not found in the buffer, dividing a buffer data area from the internal memory according to the size of the to-be-read data and an actual physical block size of the flash memory; and reading the to-be-read data from the flash memory according to the physical address and buffering the to-be-read data into the buffer data area.

With reference to the fifth aspect, in a first implementation manner of the fifth aspect, a size of the buffer data area is greater than the size of the to-be-read data, and the size of the buffer data area is an integer multiple of the actual physical block size of the flash memory.

With reference to the fifth aspect, in a second implementation manner of the fifth aspect, a size of the buffer data area is equal to the size of the to-be-read data, and the size of the buffer data area is an integer multiple of the actual physical block size of the flash memory.

With reference to the first implementation manner of the fifth aspect or the second implementation manner of the fifth aspect, in a third implementation manner of the fifth aspect, the one or more programs further include dividing a buffer_head that corresponds to the buffer data area from the internal memory, and buffering attribute information of the buffer data area and the physical address into the buffer_head, where the attribute information of the buffer data area includes an address and the size of the buffer data area.

With reference to the fifth aspect or any implementation manner of the foregoing three implementation manners of the fifth aspect, in a fourth implementation manner of the fifth aspect, the actual physical block size of the flash memory is acquired by a driver layer of the flash memory from a correspondence table between identifier information CID of the flash memory and the actual physical block size of the flash memory according to the identifier information CID of the flash memory.

With reference to the fifth aspect, in a fifth implementation manner of the fifth aspect, the one or more programs further include receiving the actual physical block size of the flash memory that is sent by the driver layer of the flash memory using a block device layer of the flash memory.

According to a sixth aspect, user equipment is provided, where the equipment includes a network interface; one or more processors; a storage, where the storage includes internal memory and a flash memory; and one or more programs, stored in the storage and configured to be executed by the one or more processors, where the one or more programs include receiving a write data instruction, where the write data instruction includes to-be-written data, a size of the to-be-written data, and a physical address of the to-be-written data in the flash memory; dividing a buffer data area from internal memory according to the size of the to-be-written data and an actual physical block size of the flash memory, and dividing a buffer_head that corresponds to the buffer data area; buffering the to-be-written data into the buffer data area, and buffering attribute information of the buffer data area and the physical address into the buffer_head, where the attribute information of the buffer data area includes an address and a size of the buffer data area; and writing the to-be-written data into the flash memory according to the physical address.

With reference to the sixth aspect, in a first implementation manner of the sixth aspect, the one or more programs further includes adding identifier information to the buffer data area, and when data in the buffer data area is not consistent with data in the flash memory, identifying the identifier information as information indicating dirty data; and when an occupancy rate of the internal memory is greater than a preset first threshold, writing, into the flash memory, data in the buffer data area that corresponds to the identifier information being the information indicating dirty data; or when a time that the buffer data area resides is greater than a preset second threshold, writing, into the flash memory, data in the buffer data area that corresponds to the identifier information being the information indicating dirty data.

In the method and the apparatus for reading/writing data from/into a flash memory, and the user equipment that are provided by the embodiments of the present disclosure, a buffer data area is applied for according to an actual physical block size of the flash memory, which achieves an objective of dynamically adjusting the buffer data area, that is, unifying a unit of reading/writing, by a processor, data from/into the flash memory and a unit of reading/writing data inside the flash memory, thereby resolving problems of low reading and writing efficiency of the flash memory and a short service life of the flash memory.

DESCRIPTION OF EMBODIMENTS

To make the objectives, technical solutions, and advantages of the embodiments of the present disclosure clearer, the following clearly describes the technical solutions in the embodiments of the present disclosure with reference to the accompanying drawings in the embodiments of the present disclosure. The described embodiments are some but not all of the embodiments of the present disclosure. All other embodiments obtained by a person of ordinary skill in the art based on the embodiments of the present disclosure without creative efforts shall fall within the protection scope of the present disclosure.

To provide thorough understanding of the present disclosure, the following further describes the embodiments of the present disclosure in detail with reference to the accompanying drawings. The foregoing embodiments are not intended to limit the protection scope of the present disclosure.

Figure 1:
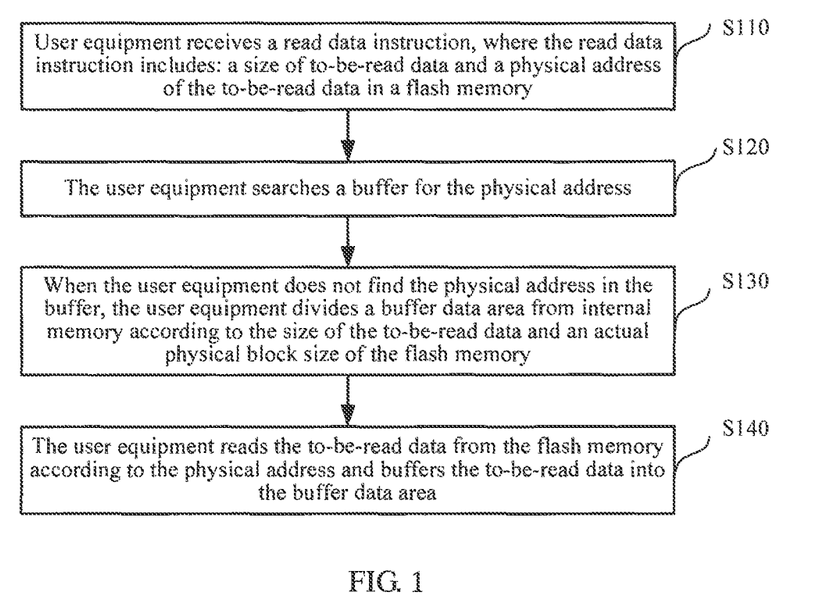
FIG. 1 is a flowchart of a method for reading data from a flash memory according to Embodiment 1 of the present disclosure.

FIG. 1 is a flowchart of a method for reading data from a flash memory according to Embodiment 1 of the present disclosure. As shown in FIG. 1, the method includes the following steps.

S110: User equipment receives a read data instruction, where the read data instruction includes a size of to-be-read data and a physical address of the to-be-read data in the flash memory. S110 may be performed by a processor of the user equipment.

A flash memory is a form of an electrically-erasable programmable read only memory and is allowed to be erased or written multiple times in an operation, and the flash memory is a non-volatile memory. The flash memory is a storage medium that user equipment uses to permanently store data. In this specification, an example in which the flash memory is an NAND flash is used for description, and the NAND flash is built into an eMMC. When the user equipment reads data from the flash memory, data in the flash memory needs to be buffered in internal memory first; or when the user equipment writes data into the flash memory, the data also needs to be buffered in the internal memory, and then the data is written into the flash memory.

It should be noted that, for eMMCs of different manufacturers, actual physical block sizes (Block sizes) of flash memories that correspond to the eMMCs are different. In addition, for different types of eMMCs, actual physical Block sizes of flash memories that correspond to the eMMCs are also different. An actual physical block size of a flash memory is used to indicate a unit of reading/writing data inside an eMMC, and a larger value indicates better performance of data reading/writing inside the eMMC.

S120: The user equipment searches a buffer for the physical address. S120 may be performed by the processor of the user equipment.

Figure 2:
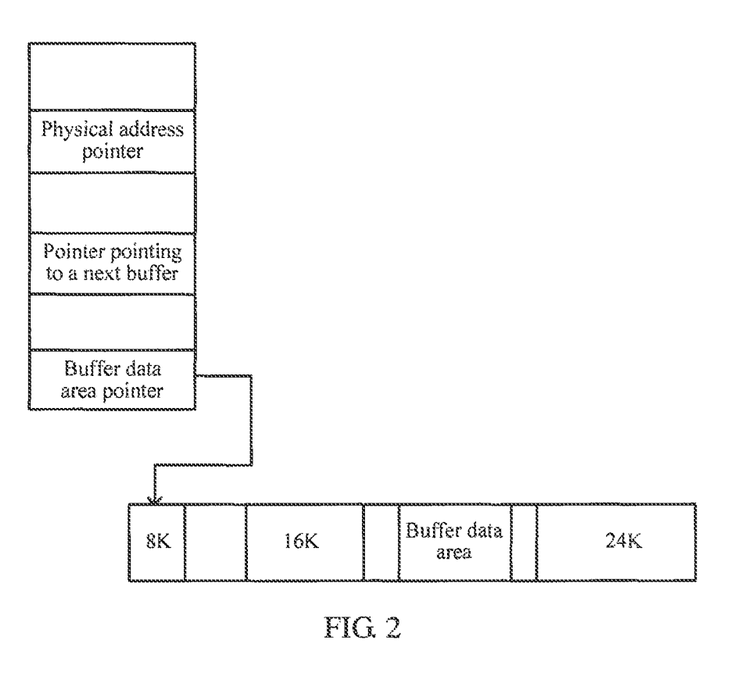
FIG. 2 is a logic schematic diagram of a buffer according to the present disclosure.

It should be noted that, a buffer buffer cache is a part of internal memory, and in a Linux system, all free internal memory may be used as the buffer. The buffer is used to store data in a flash memory, so that access by a processor to the data in the flash memory is accelerated. FIG. 2 is a logic schematic diagram of a buffer according to the present disclosure, where the buffer mainly includes two parts: a buffer_head and a buffer data area (buffer_data), where the buffer_head includes all information required by a processor for operating the buffer. The buffer_head includes a physical address pointer (b_blocknr), a pointer pointing to a next buffer (b_reqnext), and a buffer data area pointer (b_data), where b_blocknr is used to store a physical address of data in the buffer data area in a flash memory, b_reqnext is used to store an address of the next buffer, and b_data is used to store an address and a size of the buffer data area. buffer_data is a buffer data area that corresponds to the buffer_head and is used to store data, and data in the buffer data area corresponds to a block in the flash memory. A size of each buffer_data is not fixed. It should be noted that the buffer_head and the buffer data area are dynamically established in a process of reading data, and information about the buffer_head and data buffered in the buffer data area are also dynamically filled. When the processor needs to process multiple different instructions for reading data (that is, needs to read different pieces of data multiple times), multiple buffers need to be established. Therefore, when the processor receives a read data instruction the first time, no buffer exists in internal memory.

It should be noted that when the processor already reads multiple different pieces of data, multiple buffers are established, and each buffer includes a buffer_head and a buffer data area. If the processor receives a read data instruction again, the processor scans established buffer_headers in order, and compares physical addresses buffered in the established buffer_headers with a physical address in the newly received read data instruction, and if a comparison result is that the two are the same, directly returns data in buffer data areas that correspond to the buffer_headers, and if the comparison result is that the two are different, it indicates that the physical address is not found in the established buffer_headers.

S130: When the user equipment does not find the physical address in the buffer, the user equipment divides a buffer data area from internal memory according to the size of the to-be-read data and an actual physical block size of the flash memory. S130 may be performed by the processor of the user equipment.

The actual physical block size of the flash memory is acquired by a driver layer (Host Layer) of the flash memory from a correspondence table between CID of the flash memory and the actual physical block size of the flash memory according to the identifier information CID of the flash memory. The table of the correspondence between the identifier information CID of the flash memory and the actual physical block size of the flash memory is pre-established. A specific establishment process is that preset identifier information of the flash memory is acquired from a data sheet of an manufacturer using a standard command, and then a manufacturer identifier (ID) is acquired from the acquired preset identifier information of the flash memory, and after the manufacturer ID is acquired, a model of the flash memory is further acquired from the CID according to the manufacturer ID, and then it is determined whether the model of the flash memory is in a lookup table (LUT), and if yes, an actual physical block size of the flash memory in the LUT table is returned; otherwise, a default value 512 bytes is returned. After the actual physical block size of the flash memory or the default value is acquired, the table of the correspondence between the identifier information CID of the flash memory and the actual physical block size of the flash memory can be established.

Optionally, after acquiring the actual physical block size of the flash memory, the driver layer of the flash memory feeds back the acquired actual physical block size of the flash memory to a block device layer of the flash memory, and finally sends the actual physical block size of the flash memory using the block device layer to the processor using a submit_bio interface function.

The buffer data area is divided from the internal memory, that is, the buffer data area is established. Partial space in the internal memory is used as the buffer data area, and the space is indicated using a start address and an end address. For example, a size of the internal memory is 4 gigabyte (G), where no data is stored between an address 2000 KB and an address 4000 KB, so that the processor may divide 2000 KB to 2008 KB from the space, and space of total 8 KB is used as the buffer data area.

When the physical address is not found in the buffer, it indicates that the processor does not read the to-be-read data before, that is, the to-be-read data is not buffered in the buffer data area. The processor needs to establish a buffer, where a size of a buffer data area of the buffer is greater than the size of the to-be-read data, and the size of the buffer data area is an integer multiple of the actual physical block size of the flash memory, or a size of a buffer data area is equal to the size of the to-be-read data, and the size of the buffer data area is an integer multiple of the actual physical block size of the flash memory. For example, the actual physical block size of the flash memory is 8 K. However, if the size of the to-be-read data is 2 K, a size of the buffer data area divided from the internal memory is 8 K, and the size of the buffer data area is one time of the actual physical block size of the flash memory, and if the size of the to-be-read data is 22 K, the size of the buffer data area divided from the internal memory is 24 K, and the size of the buffer data area is three times of the actual physical block size of the flash memory.

Optionally, after the dividing a buffer data area from internal memory and before the reading the to-be-read data from the flash memory according to the physical address, the method further includes dividing a buffer_head that corresponds to the buffer data area from the internal memory, and buffering attribute information of the buffer data area and the physical address into the buffer_head, where the attribute information of the buffer data area includes an address and the size of the buffer data area. For example, if a start address of the buffer data area is 200 K, and the size is 24 K, the start address 200 K and the size 24 K are stored in the buffer_head that corresponds to the buffer data area.

S140: The user equipment reads the to-be-read data from the flash memory according to the physical address and buffers the to-be-read data into the buffer data area. S140 may be performed by the processor of the user equipment.

The processor sends a block device read request to the driver layer of the flash memory using the submit_bio interface function, where the read request includes the physical address. The block device layer of the flash memory receives the block device read request using an mmc_request interface function, and after receiving the block device read request, the block device layer of the flash memory sends a read command to the driver layer of the flash memory, where the read command includes the physical address, and the driver layer of the flash memory acquires the to-be-read data from the flash memory according to the physical address in the received read command.

After acquiring the to-be-read data, the driver layer of the flash memory sends the to-be-read data to the block device layer of the flash memory; after receiving the to-be-read data, the block device layer of the flash memory buffers the to-be-read data into a physical buffer, and forwards the to-be-read data to the processor; and after receiving the to-be-read data, the processor buffers the to-be-read data into the divided buffer data area and returns the to-be-read data to an upper-layer application.

In summary, in the method for reading data from a flash memory that is provided by this embodiment of the present disclosure, a buffer data area is applied for according to an actual physical block size of the flash memory, which achieves an objective of dynamically adjusting the buffer data area, that is, unifying a unit of reading, by a processor, data from the flash memory and a unit of reading data inside the flash memory, thereby resolving problems of low reading efficiency of the flash memory and a short service life of the flash memory.

Figure 3:
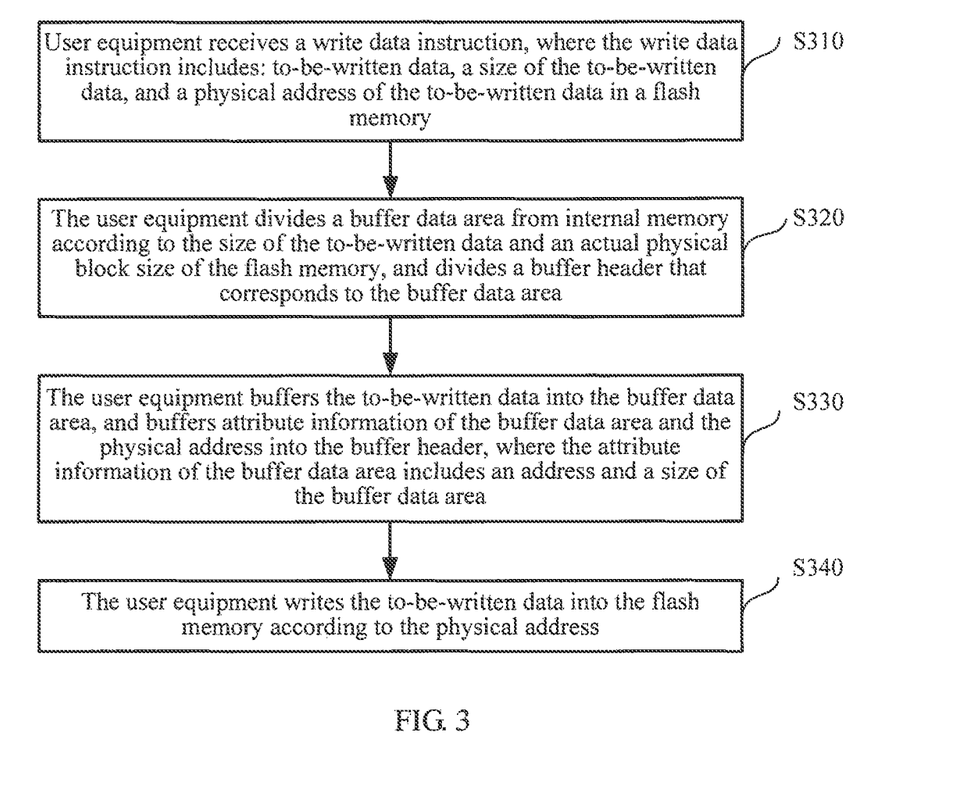
FIG. 3 is a flowchart of a method for writing data into a flash memory according to Embodiment 2 of the present disclosure.

FIG. 3 is a flowchart of a method for writing data into a flash memory according to Embodiment 2 of the present disclosure. As shown in FIG. 3, the method includes the following steps.

S310: User equipment receives a write data instruction, where the write data instruction includes to-be-written data, a size of the to-be-written data, and a physical address of the to-be-written data in the flash memory. S310 may be performed by a processor of the user equipment.

A flash memory is a form of an electrically-erasable programmable read only memory and is allowed to be erased or written multiple times in an operation, and the flash memory is a non-volatile memory. The flash memory is a storage medium that user equipment uses to permanently store data. In this specification, an example in which the flash memory is an NAND flash is used for description, and the NAND flash is built into an eMMC. When the user equipment reads data from the flash memory, data in the flash memory needs to be buffered in internal memory first, or when the user equipment writes data into the flash memory, the data also needs to be buffered in the internal memory, and then the data is written into the flash memory.

S320: The user equipment divides a buffer data area from internal memory according to the size of the to-be-written data and an actual physical block size of the flash memory, and divides a buffer_head that corresponds to the buffer data area. S320 may be performed by the processor of the user equipment.

It should be noted that the buffer_head and the buffer data area are dynamically established in a process of writing data into the flash memory, and information about the buffer_head and data buffered in the buffer data area are also dynamically filled. When the processor needs to process multiple different instructions for writing data (that is, needs to write different pieces of data multiple times), multiple buffers need to be established. Therefore, when the processor receives a write data instruction the first time, no buffer exists in the internal memory. When the processor already writes multiple different pieces of data into the flash memory, multiple buffers are established, and each buffer includes a buffer_head and a buffer data area.

It should be noted that a size of the buffer data area is greater than the size of the to-be-read data, and the size of the buffer data area is an integer multiple of the actual physical block size of the flash memory, or a size of the buffer data area is equal to the size of the to-be-read data, and the size of the buffer data area is an integer multiple of the actual physical block size of the flash memory.

S330: The user equipment buffers the to-be-written data into the buffer data area, and buffers attribute information of the buffer data area and the physical address into the buffer_head, where the attribute information of the buffer data area includes an address and a size of the buffer data area. S330 may be performed by the processor of the user equipment.

For example, if a start address of the buffer data area is 200 K, and the size is 24 K, the start address 200 K and the size 24 K are stored in the buffer_head that corresponds to the buffer data area.

S340: The user equipment writes the to-be-written data into the flash memory according to the physical address. S340 may be performed by the processor of the user equipment. The writing the to-be-written data into the flash memory according to the physical address is as described in the following.

The processor sends a block device write request to a driver layer of the flash memory using a submit_bio interface function, where the write request includes the physical address. A block device layer of the flash memory receives the block device write request using an mmc_request interface function, and after receiving the block device write request, the block device layer of the flash memory forwards the block device write request to the driver layer of the flash memory, and finally, a driver layer related to the flash memory writes the to-be-written data into the flash memory according to the physical address and returns information indicating that the writing is successful to the block device layer of the flash memory.

After receiving the information indicating that the writing is successful, the block device layer of the flash memory forwards the information indicating that the writing is successful to the processor, and finally, the processor returns the information indicating that the writing is successful to an upper-layer application and waits to receive a next write data instruction.

In summary, in the method for writing data into a flash memory that is provided by this embodiment of the present disclosure, a buffer data area is applied for according to an actual physical block size of the flash memory, which achieves an objective of dynamically adjusting the buffer data area, that is, unifying a unit of writing, by a processor, data into the flash memory and a unit of writing data inside the flash memory, thereby resolving problems of low writing efficiency of the flash memory and a short service life of the flash memory.

Optionally, the method may further include the following steps.

S350: Add identifier information to the buffer data area, and when data in the buffer data area is not consistent with data in the flash memory, identify the identifier information as information indicating dirty data.

Figure 4:
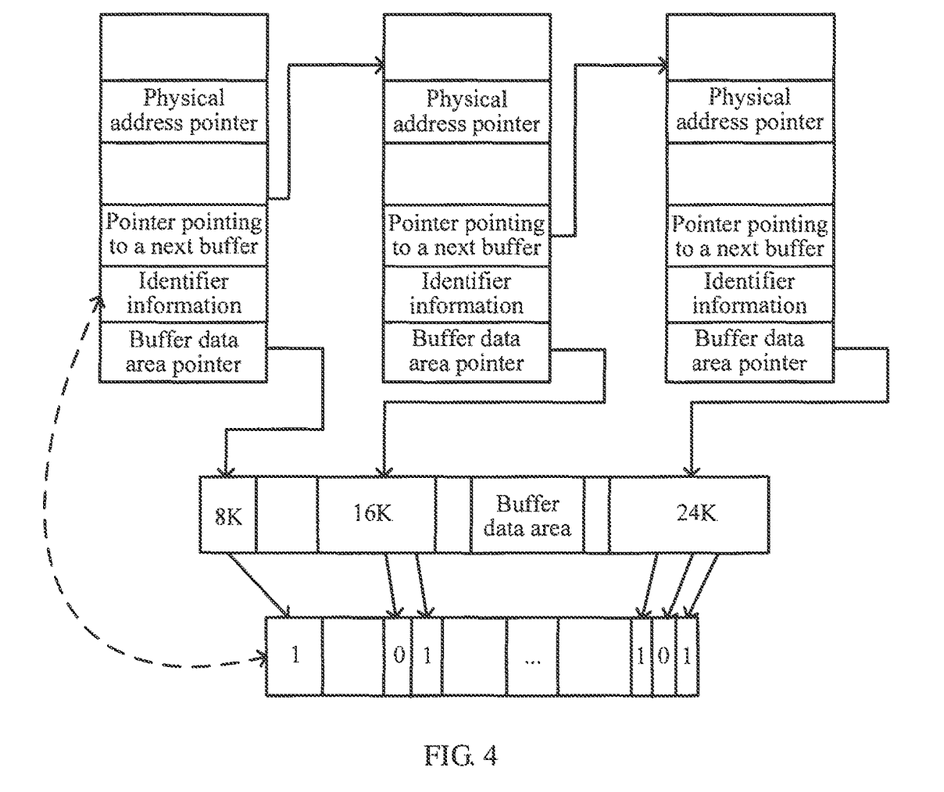
FIG. 4 is a logic schematic diagram of a buffer after identifier information is added according to the present disclosure.

Because of a buffering function of a buffer, an operation of data writing is actually delayed, and when the data in the buffer data area is newer than the data in the flash memory, the data is referred to as dirty data. In a specific implementation manner of the present disclosure, for adding identifier information to the buffer data area, refer to a logic schematic diagram of a buffer after identifier information is added, which is shown in FIG. 4. In FIG. 4, three buffers are included, and each buffer includes a buffer_head and a buffer buffer_data, where the buffer_head includes b_blocknr, b_reqnext, identifier information (dirty), and b_data, where b_blocknr is used to store a physical address of data in a corresponding buffer_data area in a flash memory, b_reqnext is used to store an address of a next buffer, dirty is newly added identifier information, and when the identifier information is 0, it indicates that the data in the corresponding buffer data area is normal data, and when the identifier information is 1, it indicates that the data in the corresponding buffer data area is dirty data; and b_data is used to store an address and a size of the corresponding buffer data area; buffer_data is a corresponding buffer data area and is used to store data, and a size of each buffer_data is not fixed, but buffer_data uses an actual physical block size of the flash memory as a unit.

The adding identifier information to the buffer data area is adding the identifier information to the buffer data area using the actual physical block size of the flash memory as a unit. As shown in FIG. 4, it is assumed that the actual physical block size of the flash memory is 8 K, and because 8 K is one time of the actual physical block size of the flash memory, one piece of identifier information is added; 16 K is two times of the actual physical block size of the flash memory, two pieces of identifier information are added; and 24 K is three times of the actual physical block size of the flash memory, three pieces of identifier information are added.

S360: When an occupancy rate of the internal memory is greater than a preset first threshold, write, into the flash memory, data in the buffer data area that corresponds to the identifier information being the information indicating dirty data; or when a time that the buffer data area resides is greater than a preset second threshold, write, into the flash memory, data in the buffer data area that corresponds to the identifier information being the information indicating dirty data.

In FIG. 4, when the buffer data area is identified as the information indicating dirty data, that is, a dirty value of the buffer data area is 0, there are two cases in which the data in the buffer data area is written back to the flash memory: 1) when the occupancy rate of the internal memory is greater than the preset first threshold, the data in the buffer data area that corresponds to the identifier information being the information indicating dirty data is written into the flash memory; and 2) when the time that the buffer data area resides in the internal memory is greater than the preset second threshold, the data in the buffer data area that corresponds to the identifier information being the information indicating dirty data is written into the flash memory.

By means of the foregoing two manners, it can be ensured that the data in the buffer data area does not reside in the internal memory indefinitely.

It should be noted that a flush daemon may detect all buffer data areas that are identified as information indicating dirty data in buffer_headers at the same time, so that data in the buffer data areas is written into the flash memory.

Figure 5:
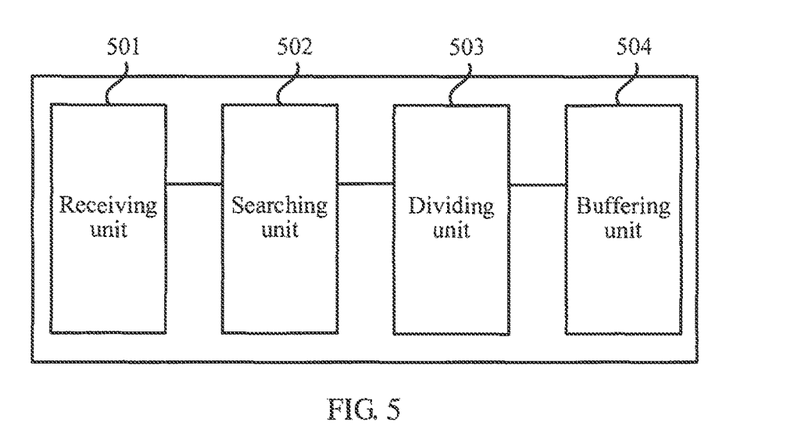
FIG. 5 is a schematic diagram of an apparatus for reading data from a flash memory according to Embodiment 3 of the present disclosure.

FIG. 5 is a schematic diagram of an apparatus for reading data from a flash memory according to Embodiment 3 of the present disclosure. The apparatus may be used to perform the method shown in FIG. 1. In FIG. 5, the apparatus includes a receiving unit 501, a searching unit 502, a dividing unit 503, and a buffering unit 504, where the receiving unit 501 is configured to receive a read data instruction, where the read data instruction includes a size of to-be-read data and a physical address of the to-be-read data in the flash memory; the searching unit 502 is configured to search a buffer for the physical address received by the receiving unit 501; the dividing unit 503 is configured to, when the searching unit 502 does not find the physical address in the buffer, divide a buffer data area from internal memory according to the size of the to-be-read data and an actual physical block size of the flash memory; and the buffering unit 504 is configured to read the to-be-read data from the flash memory according to the physical address and buffer the to-be-read data into the buffer data area divided by the dividing unit 503.

Optionally, the dividing unit 503 is further configured to divide a buffer_head that corresponds to the buffer data area from the internal memory, and buffer attribute information of the buffer data area and the physical address to the buffer_head, where the attribute information of the buffer data area includes an address and a size of the buffer data area, where the size of the buffer data area is greater than the size of the to-be-read data, and the size of the buffer data area is an integer multiple of the actual physical block size of the flash memory; or the size of the buffer data area is equal to the size of the to-be-read data, and the size of the buffer data area is an integer multiple of the actual physical block size of the flash memory; and the actual physical block size of the flash memory is acquired by a driver layer of the flash memory from a correspondence table between identifier information CID of the flash memory and the actual physical block size of the flash memory according to the identifier information CID of the flash memory.

Optionally, the receiving unit 501 is further configured to receive the actual physical block size of the flash memory that is sent by the driver layer of the flash memory using a block device layer of the flash memory.

Figure 6:
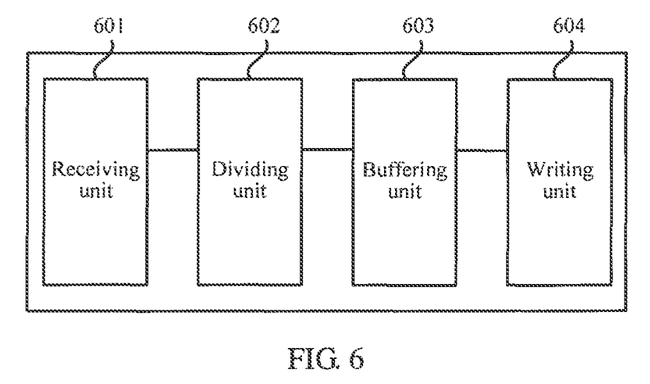
FIG. 6 is a schematic diagram of an apparatus for writing data into a flash memory according to Embodiment 4 of the present disclosure.

FIG. 6 is a schematic diagram of an apparatus for writing data into a flash memory according to Embodiment 4 of the present disclosure. The apparatus may be used to perform the method shown in FIG. 3. In FIG. 6, the apparatus includes a receiving unit 601, a dividing unit 602, a buffering unit 603, and a writing unit 604, where the receiving unit 601 is configured to receive a write data instruction, where the write data instruction includes to-be-written data, a size of the to-be-written data, and a physical address of the to-be-written data in the flash memory; the dividing unit 602 is configured to divide a buffer data area from internal memory according to the size of the to-be-written data received by the receiving unit 601 and an actual physical block size of the flash memory, and divide a buffer_head that corresponds to the buffer data area; the buffering unit 603 is configured to buffer the to-be-written data into the buffer data area divided by the dividing unit 602, and buffer attribute information of the buffer data area and the physical address into the buffer_head divided by the dividing unit, where the attribute information of the buffer data area includes a logical address and a size of the buffer data area; and the writing unit 604 is configured to write the to-be-written data into the flash memory according to the physical address.

Optionally, the apparatus further includes an adding unit 605 configured to add identifier information to the buffer data area, and when data in the buffer data area is not consistent with data in the flash memory, identify the identifier information as information indicating dirty data.

The writing unit 604 is further configured to, when an occupancy rate of the internal memory is greater than a preset first threshold, write, into the flash memory, data in the buffer data area that corresponds to the identifier information, being the information indicating dirty data, added by the adding unit; or when a time that the buffer data area resides is greater than a preset second threshold, write, into the flash memory, data in the buffer data area that corresponds to the identifier information, being the information indicating dirty data, added by the adding unit.

In the apparatus for reading data from a flash memory and the apparatus for writing data into a flash memory that are provided by the embodiments of the present disclosure, a buffer data area is applied for according to an actual physical block size of the flash memory, which achieves an objective of dynamically adjusting the buffer data area, that is, unifying a unit of reading/writing, by a processor, data from/into the flash memory and a unit of reading/writing data inside the flash memory, thereby resolving problems of low reading and writing efficiency of the flash memory and a short service life of the flash memory.

Figure 7:
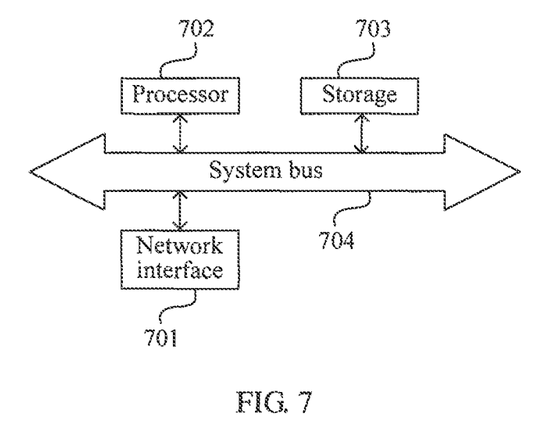
FIG. 7 is a schematic diagram of user equipment according to Embodiment 5 of the present disclosure.

FIG. 7 is a schematic diagram of user equipment according to Embodiment 5 of the present disclosure. As shown in FIG. 7, the equipment includes a network interface 701, one or more processors 702, a storage 703, and a system bus 704 configured to connect to the network interface 701, the processor 702, and the memory 703. For example, the processor 702 may be a central processing unit (CPU). The network interface 701 is configured to communicate with another device.

The storage 703 includes internal memory and a flash memory. One or more programs are stored in the storage 703 and are configured to be executed by the one or more processors 702, where the one or more programs include receiving a read data instruction, where the read data instruction includes a size of to-be-read data and a physical address of the to-be-read data in the flash memory; searching a buffer for the physical address; when the physical address is not found in the buffer, dividing a buffer data area from the internal memory according to the size of the to-be-read data and an actual physical block size of the flash memory; and reading the to-be-read data from the flash memory according to the physical address and buffering the to-be-read data into the buffer data area.

Optionally, a size of the buffer data area is greater than the size of the to-be-read data, and the size of the buffer data area is an integer multiple of the actual physical block size of the flash memory.

Optionally, a size of the buffer data area is equal to the size of the to-be-read data, and the size of the buffer data area is an integer multiple of the actual physical block size of the flash memory.

Further, the one or more programs further include dividing a buffer_head that corresponds to the buffer data area from the internal memory, and buffering attribute information of the buffer data area and the physical address into the buffer_head, where the attribute information of the buffer data area includes an address and the size of the buffer data area.

Optionally, the actual physical block size of the flash memory is acquired by a driver layer of the flash memory from a correspondence table between identifier information CID of the flash memory and the actual physical block size of the flash memory according to the identifier information CID of the flash memory.

Further, the one or more programs further include receiving the actual physical block size of the flash memory that is sent by the driver layer of the flash memory using a block device layer of the flash memory.

Figure 8:
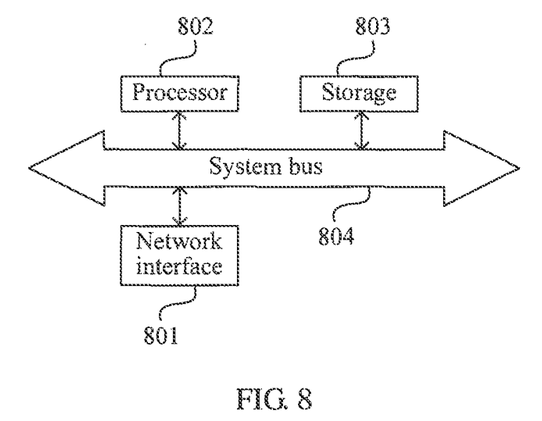
FIG. 8 is a schematic diagram of user equipment according to Embodiment 6 of the present disclosure.

FIG. 8 is a schematic diagram of user equipment according to Embodiment 6 of the present disclosure. As shown in FIG. 8, the equipment includes a network interface 801, one or more processors 802, a memory 803, and a system bus 804 configured to connect to the network interface 801, the processor 802, and the storage 803. For example, the processor 802 may be a CPU. The network interface 801 is configured to communicate with another device.

The storage 803 includes internal memory and a flash memory. One or more programs are stored in the storage 803 and are configured to be executed by the one or more processors 802, where the one or more programs include receiving a write data instruction, where the write data instruction includes to-be-written data, a size of the to-be-written data, and a physical address of the to-be-written data in the flash memory; dividing a buffer data area from internal memory according to the size of the to-be-written data and an actual physical block size of the flash memory, and dividing a buffer_head that corresponds to the buffer data area; buffering the to-be-written data into the buffer data area, and buffering attribute information of the buffer data area and the physical address into the buffer_head, where the attribute information of the buffer data area includes an address and a size of the buffer data area; and writing the to-be-written data into the flash memory according to the physical address.

Further, the one or more programs further include adding identifier information to the buffer data area, and when data in the buffer data area is not consistent with data in the flash memory, identifying the identifier information as information indicating dirty data; and when an occupancy rate of the internal memory is greater than a preset first threshold, writing, into the flash memory, data in the buffer data area that corresponds to the identifier information being the information indicating dirty data; or when a time that the buffer data area resides is greater than a preset second threshold, writing, into the flash memory, data in the buffer data area that corresponds to the identifier information being the information indicating dirty data.

In the user equipment that is provided by the embodiments of the present disclosure, a buffer data area is applied for according to an actual physical block size of a flash memory, which achieves an objective of dynamically adjusting the buffer data area, that is, unifying a unit of reading/writing, by a processor, data from/into the flash memory and a unit of reading/writing data inside the flash memory, thereby resolving problems of low reading and writing efficiency of the flash memory and a short service life of the flash memory.

A person skilled in the art may be further aware that, in combination with the examples described in the embodiments disclosed in this specification, units and algorithm steps may be implemented by electronic hardware, computer software, or a combination thereof. To clearly describe the interchangeability between the hardware and the software, the foregoing has generally described compositions and steps of each example according to functions. Whether the functions are performed by hardware or software depends on particular applications and design constraint conditions of the technical solutions. A person skilled in the art may use different methods to implement the described functions for each particular application, but it should not be considered that the implementation goes beyond the scope of the present disclosure.

Steps of methods or algorithms described in the embodiments disclosed in this specification may be implemented by hardware, a software module executed by a processor, or a combination thereof. The software module may reside in a random access memory (RAM), a memory, a read-only memory (ROM), an electrically programmable ROM, an electrically erasable programmable ROM (EEPROM), a register, a hard disk, a removable disk, a compact disc ROM (CD-ROM), or any other form of storage medium known in the art.

In the foregoing specific implementation manners, the objective, technical solutions, and benefits of the present disclosure are further described in detail. It should be understood that the foregoing descriptions are merely specific implementation manners of the present disclosure, but are not intended to limit the protection scope of the present disclosure. Any modification, equivalent replacement, or improvement made without departing from the spirit and principle of the present disclosure should fall within the protection scope of the present disclosure.

What is claimed is:

1. A method for reading data from a flash memory of a device, implemented by a processor of the device, comprising:

receiving a read data instruction, wherein the read data instruction comprises a size of to-be-read data and a physical address of the to-be-read data in the flash memory;

searching a buffer for the physical address;

dividing a buffer data area from internal memory according to the size of the to-be-read data and an actual physical block size of the flash memory when the physical address is not found in the buffer;

dividing a buffer header that corresponds to the buffer data area from the internal memory, and buffering attribute information of the buffer data area and the physical address into the buffer header, wherein the attribute information of the buffer data area comprises an address and the size of the buffer data area; and reading the to-be-read data from the flash memory according to the physical address and buffering the to-be-read data into the buffer data area.

2. The method according to claim 1, wherein a size of the buffer data area is greater than the size of the to-be-read data, and wherein the size of the buffer data area is an integer multiple of the actual physical block size of the flash memory.

3. The method according to claim 1, wherein a size of the buffer data area is equal to the size of the to-be-read data, and wherein the size of the buffer data area is an integer multiple of the actual physical block size of the flash memory.

4. The method according to claim 1, wherein the actual physical block size of the flash memory is acquired by a driver layer of the flash memory from a correspondence table between identifier information card identity (CID) of the flash memory and the actual physical block size of the flash memory according to the identifier information CID of the flash memory.

5. The method according to claim 1, wherein before the receiving a read data instruction, the method further comprises receiving the actual physical block size of the flash memory that is sent by a driver layer of the flash memory by using a block device layer of the flash memory.

6. A method for writing data into a flash memory of a device, implemented by a processor of the device, comprising:

receiving a write data instruction, wherein the write data instruction comprises to-be-written data, a size of the to-be-written data, and a physical address of the to-be-written data in the flash memory;

dividing a buffer data area from internal memory according to the size of the to-be-written data and an actual physical block size of the flash memory, and dividing a buffer header that corresponds to the buffer data area;

buffering the to-be-written data into the buffer data area, and buffering attribute information of the buffer data area and the physical address into the buffer header, wherein the attribute information of the buffer data area comprises an address and a size of the buffer data area;

writing the to-be-written data into the flash memory according to the physical address;

adding identifier information to the buffer data area, and when data in the buffer data area is not consistent with data in the flash memory, identifying the identifier information as information indicating dirty data; and writing, into the flash memory, data in the buffer data area that corresponds to the identifier information being the information indicating dirty data when an occupancy rate of the internal memory is greater than a preset first threshold.

7. The method according to claim 6, wherein when a time that the buffer data area resides is greater than a preset second threshold, writing, into the flash memory, data in the buffer data area that corresponds to the identifier information being the information indicating dirty data.

8. A device, comprising:

a network interface;

a storage comprising internal memory and a flash memory, wherein the storage stores one or more executable programs; and one or more processors coupled to the network interface and the storage, wherein the one or more processors is configured to:

receive a read data instruction, wherein the read data instruction comprises a size of to-be-read data and a physical address of the to-be-read data in the flash memory;

search a buffer for the physical address;

divide a buffer data area from the internal memory according to the size of the to-be-read data and an actual physical block size of the flash memory when the physical address is not found in the buffer;

read the to-be-read data from the flash memory according to the physical address and buffering the to-be-read data into the buffer data area; and receive the actual physical block size of the flash memory that is sent by a driver layer of the flash memory by using a block device layer of the flash memory.

9. The device according to claim 8, wherein a size of the buffer data area is greater than the size of the to-be-read data, and wherein the size of the buffer data area is an integer multiple of the actual physical block size of the flash memory.

10. The device according to claim 8, wherein a size of the buffer data area is equal to the size of the to-be-read data, and wherein the size of the buffer data area is an integer multiple of the actual physical block size of the flash memory.

11. The device according to claim 9, wherein the one or more processors is further configured to:

divide a buffer header that corresponds to the buffer data area from the internal memory; and buffer attribute information of the buffer data area and the physical address into the buffer header, wherein the attribute information of the buffer data area comprises an address and the size of the buffer data area.

12. The device according to claim 11, wherein the actual physical block size of the flash memory is acquired by a driver layer of the flash memory from a correspondence table between identifier information card identity (CID) of the flash memory and the actual physical block size of the flash memory according to the identifier information CID of the flash memory.

* * * * *